United States Patent [19]
Lee et al.

[11] Patent Number: 5,319,206
[45] Date of Patent: Jun. 7, 1994

[54] METHOD AND APPARATUS FOR ACQUIRING AN X-RAY IMAGE USING A SOLID STATE DEVICE

[75] Inventors: Denny L. Y. Lee, West Chester; Lawrence K. Cheung, Berwyn, both of Pa.

[73] Assignee: E. I. Du Pont de Nemours and Company, Wilmington, Del.

[21] Appl. No.: 992,813

[22] Filed: Dec. 16, 1992

[51] Int. Cl.⁵ .................. G01T 1/24; H01L 31/115
[52] U.S. Cl. .......................... 250/370.09; 250/580
[58] Field of Search ...................... 250/580, 370.09

[56] References Cited

U.S. PATENT DOCUMENTS

| | | | |
|---|---|---|---|
| 3,973,146 | 8/1976 | Arnold et al. | 257/254 |
| 4,670,765 | 6/1987 | Nakamura et al. | 307/311 |
| 4,672,454 | 6/1987 | Cannella et al. | 358/213.11 |
| 4,694,317 | 9/1987 | Higashi et al. | 257/446 |
| 4,803,359 | 2/1989 | Hosoi et al. | 250/586 |
| 4,857,723 | 8/1989 | Modisette | 250/213 R |
| 4,961,209 | 10/1990 | Rowlands et al. | 378/29 |
| 4,975,935 | 12/1990 | Hillen et al. | 378/28 |
| 5,127,038 | 6/1992 | Jeromin et al. | 378/28 |
| 5,182,624 | 1/1993 | Tran et al. | 257/40 |

FOREIGN PATENT DOCUMENTS 0125691 11/1984 European Pat. Off. .
63-3454 1/1988 Japan .

OTHER PUBLICATIONS

L. E. Antonuk et al., "Development of Hydrogenated Amorphous Silicon Sensors for High Energy Photon Radiotherapy Imaging", Nuclear Science vol. 37, No. 2, Apr. 1990 pp. 165-170.
L. E. Antonuk et al., "Development of Hydrogenated Amorphous Silicon Sensors For Diagnostic X-Ray Imaging", Nuclear Science vol. 38, No. 2, Apr. 1991, pp. 636-640.
L. E. Antonuk et al., "Signal, Noise, and Readout Considerations in the Development of Amorphous Silicon Photodiode Arrays for Radiotherapy and Diagnostic X-Ray Imaging", SPIE vol. 1443 Medical Imaging V. Image Physics 1991, pp. 108-119.
L. E. Antonuk et al., "Development Of Thin-Film, Flat-Panel Arrays For Diagnostic And Radiotherapy Imaging", SPIE Medical Imaging VI, Feb. 23-27, 1992.
L. E. Antonuk et al., "Large Area Amorphous Silicon Photodiode Arrays For Radiotherapy And Diagnostic Imaging", Nuclear Instruments and Methods in Physics Research A310 (1991) pp. 460-464.

Primary Examiner—Constantine Hannaher
Attorney, Agent, or Firm—Thomas H. Magee

[57] ABSTRACT

An X-ray image capture element includes a dielectric substrate layer having a top surface and a bottom surface. A plurality of transistors is arrayed adjacent the top surface of the dielectric layer. A plurality of charge storage capacitors is also arrayed adjacent the top surface of the dielectric layer, each capacitor having a conductive inner microplate connected to at least one of the transistors. Conductive address lines and sense lines are disposed adjacent the top surface of the dielectric layer for electronically activating the transistors and individually accessing each of the capacitors. A photoconductive layer is disposed over the transistors, address and sense lines, and a top conducting layer is disposed over the photoconductive layer opposite the dielectric layer. The image capture element also includes a plurality of charge barrier layers disposed adjacent, respectively, the top surface of each of the inner microplates, and a barrier dielectric layer disposed between and coextensive with the photoconductive layer and the top conducting layer.

14 Claims, 5 Drawing Sheets

METHOD AND APPARATUS FOR ACQUIRING AN X-RAY IMAGE USING A SOLID STATE DEVICE

BACKGROUND OF THE INVENTION

1. Field of the Invention

The present invention pertains to a method and apparatus for capturing digital radiographic images. More particularly, the present invention relates to a method and associated apparatus for capturing and readout of electrical charges representing a latent radiographic image in a unique microcapacitor matrix panel to obtain an electrical signal representing a radiogram.

2. Description of the Related Art

Traditional radiography employs a silver halide photosensitive film in a light tight cassette enclosure, to capture a latent radiographic image, which is subsequently rendered visible following chemical development and fixing. Because silver halide film is not very sensitive to X-ray radiation, and large exposures are required to obtain an image, most applications use a combination of an intensifying screen comprising a phosphor layer, with the silver halide film to achieve lower exposures.

Radiograms have also been produced by capturing a latent radiographic image using a photoconductive plate in a xeroradiographic process. In this instance, a photoconductive plate sensitive to X-ray radiation comprising at least a photoconductive layer coated over a conductive backing layer is first charged by passing under a charging station which generates corona ions. Positive or negative charge is uniformly deposited over the plate surface. The plate is next exposed to X-ray radiation. Depending on the intensity of the incident radiation, electron hole pairs generated by the X-ray radiation are separated by a field incident to the charge laid over the surface and move along the field to recombine with the surface charge. After X-ray exposure, a latent image in the form of electrical charges of varying magnitude remain on the plate surface, representing a latent electrostatic radiogram. This latent image may then be rendered visible by toning and preferably transferring onto a receiving surface for better viewing.

More recent developments include the use of an electrostatic image capture element to capture a latent X-ray image, the element comprising a photoconductive layer over a conductive support, the photoconductive layer also covered by a dielectric layer, and the dielectric layer overcoated with a transparent electrode. A biasing voltage is applied between the transparent electrode and the conductive support to charge the element which is a large parallel plate capacitor. While the bias voltage is applied, the element is exposed to image wise modulated X-ray radiation. Following exposure, the bias is removed and a latent image is preserved as a charge distribution stored across the dielectric layer. The problem with this element structure is that the latent image represented by local charge variations is a very small signal charge that must be extracted in the presence of random noise in the total capacitive charge in the full plate. Signal to noise ratio is typically poor.

In an effort to improve the signal to noise ratio, the transparent electrode is laid over the dielectric layer as a plurality of pixel size microplates having an area commensurate with the area of the smallest resolvable element in the image. In this manner, the overall plate capacity is reduced and the signal extracted per picture element has a better signal to noise ratio. Methods to readout the latent image include, inter alia, scanning the length of the transparent electrode with a laser beam while reading the charge flow from each of the microcapacitors formed between the microplates and the conductive plate. While this element is a vast improvement over the continuous electrode structure covering the full plate, the mode of use of this plate is somewhat complex particularly with respect to the manner in which the original charging of the microplates occurs.

SUMMARY OF THE INVENTION

The present invention comprises an X-ray image capture element including a dielectric substrate layer having a top surface and a bottom surface. A plurality of transistors is arrayed adjacent the top surface of the dielectric layer. A plurality of charge storage capacitors is also arrayed adjacent the top surface of the dielectric layer, each capacitor having a conductive inner microplate connected to at least one of the transistors. Conductive address lines and sense lines are disposed adjacent the top surface of the dielectric layer for electronically activating the transistors and individually accessing each of the capacitors. A photoconductive layer is disposed over the transistors, address and sense lines, and a top conducting layer is disposed over the photoconductive layer opposite the dielectric layer. The image capture element also includes a plurality of charge barrier layers disposed adjacent, respectively, the top surface of each of the inner microplates, and a barrier dielectric layer disposed between and coextensive with the photoconductive layer and the top conducting layer.

The present invention is further directed to a method for using the X-ray image capture element to capture a radiogram by exposing the photo-conductive layer to imagewise modulated radiation and determining the magnitude of electrical charges provided therein.

DETAILED DESCRIPTION OF THE PREFERRED EMBODIMENTS

Figure 1:
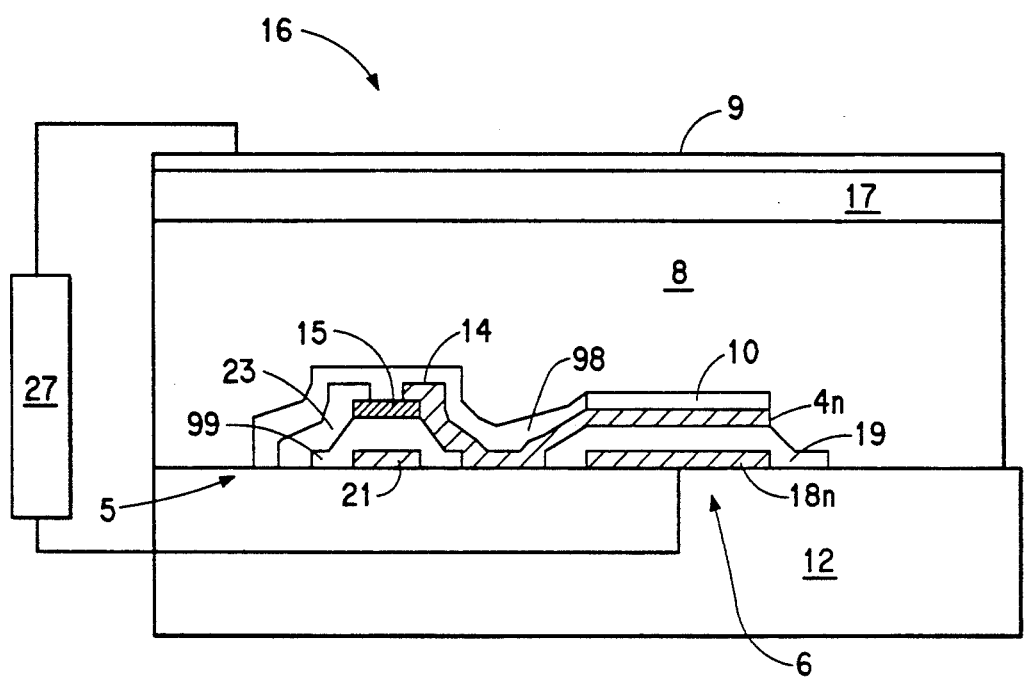
FIG. 1 is a schematic cross sectional view of an X-ray image capture element in accordance with the present invention.

FIG. 1 shows an X-ray image capture apparatus, element or panel 16 having a dielectric substrate layer 12 with a thickness to facilitate handling of the panel 16. Over the dielectric substrate layer 12 is a first plurality of discrete minute conductive electrodes 18 (ie., 18a, 18b, 18c, ... 18n) referred to herein as microplates 18n. Preferably, the microplates 18n are made of aluminum. The technology to produce such microplates 18n is well known in the art. The dimensions of the microplates 18n define the smallest picture element (pixel) resolvable by the element 16. They are deposited on the substrate dielectric layer 12, typically, though not necessarily, using thermal deposition or sputtering techniques and can be made of a very thin film of metal such as gold, silver, copper, chromium, titanium, platinum and the like. Over this first plurality of microplates is applied a capacitive dielectric material 19, preferably comprised of silicon dioxide; other materials such as silicon nitride may be used. Also deposited on the dielectric substrate layer 12 is a plurality of transistors 5 having two electrodes 23 and 14 and a gate 21. Further shown in FIG. 1 is a second plurality of microplates 4 (ie., 4a, 4b, 4c, ... 4n) referred to herein as microplates 4n. They are deposited on the dielectric substrate layer 12 typically, though not necessarily, using vacuum thermal deposition or sputtering techniques, and can be made of a very thin film of metal such as gold, silver, copper, chromium, titanium, platinum and the like. Preferably, the microplates 4n are made of aluminum or indium-tin oxide.

Figure 2:
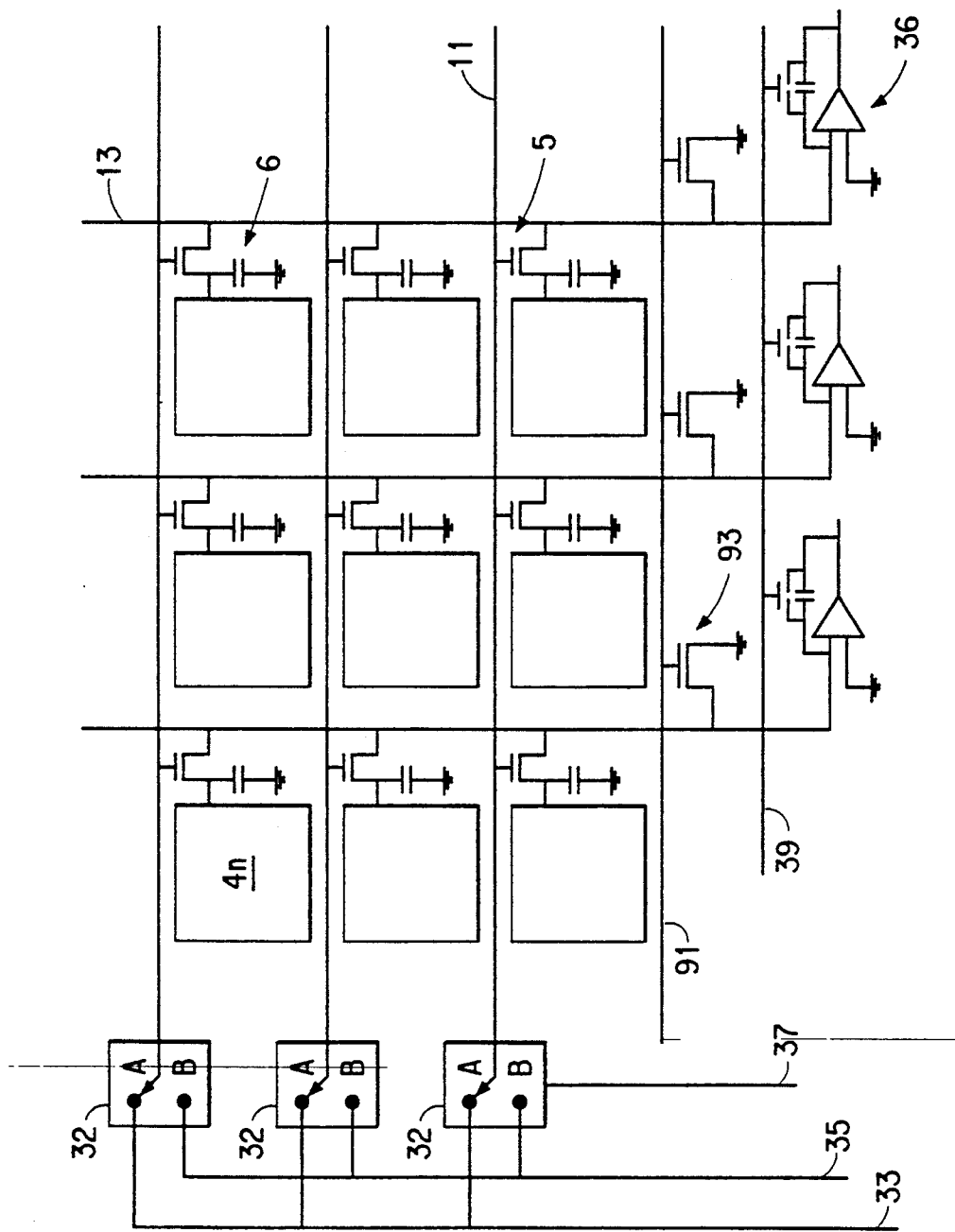
FIG. 2 is a schematic top view of the X-ray image capture element shown in FIG. 1.

FIG. 2 shows at least one transistor 5 connecting each microplate 4n to an Xn line 11. Each transistor 5, typically a FET transistor, has its gate connected to an Xn line 11 and its source or drain connected to a Yn line 13. A charge storage capacitor 6 is formed by the microplates 4n and 18n and capacitive dielectric material 19. Each microplate 4n is also connected to electrode 14 of transistor 5. Each microplate 18n is connected to electrical ground. Each transistor 5 serves as a bi-directional switch allowing current flow between the Yn line 13 sense lines and the charge storage capacitor 6 depending on whether a bias voltage is applied to its gate through Xn address lines. The transistor 5 preferably comprises a hydrogenated amorphous-silicon layer 15, an insulating layer 99, a conductive gate 21 and the two conductive electrodes, one electrode 23 being connected to the Yn sense lines 13 and the other electrode 14 to the microplates 4n as schematically depicted in FIG. 1. Each transistor could also use crystalline silicon, polycrystalline silicon or cadmium selenide. Each transistor 5 is also covered with a passivation layer 98 and can be shielded from actinic radiation using a dielectric substrate layer 12 or by using additional layers. By actinic radiation, for purposes of describing the present invention, is meant ultraviolet, infrared, or visible radiation, but excludes X-ray radiation and gamma-radiation. The technology for the creation of the transistors 5 and charge storage capacitors 6 is well known in the art and not a subject of the present invention. See, for instance, "Modular Series on Solid State Devices," Volume 5 of Introduction to Microelectronics Fabrication by R. C. Jaeger, Published by Addison-Wesley in 1988.

In the spaces between the microplates 4a, 4b, 4c ... 4n, conductive electrodes or X1, X2, ... Yn address lines 11 and conductive electrodes or Y1, Y2, ... Yn sense lines 13 are laid out. The Xn lines 11 and Yn lines 13 lines are shown laid out generally orthogonally to each other in the spaces between the outer microplates 4n. The orientation of the Xn lines 11 and Yn lines 13 is a matter of choice. The Xn address lines 11 are individually accessible through leads or connectors not specifically illustrated in the drawings, along the sides or edges of the panel 16.

For fabrication purposes, the Xn lines 11 and Yn lines 13 may be constructed from the same aluminum layer used for fabricating the microplates 4n. Since the Xn lines 11 and Yn lines 13 must not electrically contact each other where they cross over, the Yn lines 13 may be created after placing an insulating layer not shown in the figure over the Xn lines 11.

Each Yn line 13 is also connected to a charge amplifying detector 36. The detector may comprise an operational amplifier wired to measure the charge in a capacitive circuit to which the charge from the microcapacitors is directed, and which produces a voltage output proportional to such charge. The output of detectors 36 may be sampled sequentially to obtain an output signal and the technology to do this is also well known in the art.

Over the top surface of the microplates 4n there is applied a charge blocking layer 10. The charge blocking layer 10 is preferably provided by an aluminum oxide layer formed on the surface of the microplates 4n although other blocking interfaces may also be used. The subsequent coating thereon of a selenium photoconductive layer 8 produces an X-ray absorption layer. In addition, the combination of layers 4n, 10, and 8 behaves as a blocking diode, inhibiting one type of charge flow in one direction. The charge blocking layer 10 must have sufficient thickness to prevent charge leakage. In the preferred embodiment of the present invention, charge blocking layer 10 should have a thickness greater than 100 Angstroms (0.01 micrometers).

Coated over the charge blocking layer 10, the transistors 5 and the gate and sense lines is a photoconductive layer 8 having a back surface in contact with the microplates 4n, and a front surface. The photoconductive layer 8 preferably exhibits very high dark resistivity and may comprise amorphous selenium, lead oxide, cadmium sulfide, mercuric iodide or any other such material, including organic materials such as photoconductive polymers preferably loaded with X-ray absorbing compounds, which exhibit photoconductivity.

In the context of the present invention, exhibiting photoconductivity means that upon exposure to X-ray radiation, the photoconductive material exhibits reduced resistivity relative to that in the absence of such exposure. The reduced resistivity is in reality the effect of electron hole pairs generated in the material by the incident radiation. Because the capacitive time constant of a capacitor is proportional to the resistance of the capacitor, the capacitor formed by such photoconductive material has a reduced time constant upon exposure. This is electrically represented in FIG. 6. by placing a resistor 51 and a switch 52 in parallel with the capacitor formed by the photoconductive material. Before exposure to radiation, the resistance of the photoconductive material is effectively infinite; in schematic, then, equivalent to an open switch and the discharging resistor is not effective. During exposure, the resistance of the photoconductive material is lowered, equivalent to a closed switch putting the discharging resistor in parallel with the photoconductive capacitor. Preferably, the charges moving across the photoconductive layer are directly proportional to the intensity of the incident radiation.

The photoconductive layer 8 should be chosen of sufficient thickness to absorb the incident X-ray radiation, or a substantial portion thereof, to provide high efficiency in radiation detection. The specific type of material selected will further depend upon the desired charge generation efficiency and charge transport property, and the desired simplicity of manufacture. Selenium is one preferred material.

A dielectric layer 17 is added on the top front surface of the photoconductive layer 8. In the preferred embodiment of the present invention, dielectric layer 17 should have a thickness greater than one micron. Mylar ® (i.e., polyethylene terephthalate) film with a thickness of 25 micrometers may be used for layer 17, although layers of other thicknesses are suitable. A final front layer 9 of conductive material transparent to X-ray radiation is formed over the dielectric layer 17.

The dielectric layer 17, the photoconductive layer 8 and the charge storage capacitors $6n$ form three microcapacitors in series. A first microcapacitor is created between the front conducting layer 9 and the front surface of the photoconductive layer 8, and a second microcapacitor between that same photoconductive layer 8 and the microplates $4n$, and the third capacitor being the charge storage capacitor $6n$ formed between microplates $4n$ and $18n$.

The entire element 16 can be made by depositing successive layers of conductors $18n$, insulator 19, microplates $4n$, blocking layer 10, photoconductor 8, insulator 17, and conductor 9 upon a dielectric substrate layer 12. The FETs 5 are built in the spaces between the microplates $18n$ on the dielectric substrate layer 12. Fabrication may be accomplished by plasma-enhanced chemical vapor deposition, vacuum deposition, lamination, sputtering or any other known technique useful to deposit even-thickness films.

In practice, a panel 16 may be fabricated beginning with a commercially available thin film transistor panel which comprises a dielectric substrate layer 12, transistors 5, and Xn lines 11 and Yn lines 13. Commercially available panels used in making liquid crystal displays are a convenient starting point for building the panel 16 in accordance with the present invention. Charge storage capacitors 6 are formed over the outer microplates $18n$ and between the Xn lines 11 and Yn lines 13. The photoconductive layer 8 is coated over the charge blocking layer 10. The dielectric layer 17 and top conductive layer 9 are formed on the photoconductive layer 8 to complete the panel 16.

In a preferred embodiment, the conductive top layer 9, the dielectric layer 17, and the photoconductive layer 8 are continuous layers. However, it is within the contemplation of the present invention for one or more of the layers overlying the microplates $18n$ to comprise a plurality of discrete portions, formed in registration, for instance, by etching.

In FIG. 2, the Xn lines 11 terminate to a switching means comprising a first plurality of switches 32 that allow switching the Xn lines 11 to a first position A, and a second position B. Preferably, the switching means comprise electronically addressable solid state switches which may be either external or integral with the element 16. A bias voltage is applied over line 33 to all Xn lines 11 simultaneously when the Xn lines 11 are in the first position A. The bias voltage on the Xn lines 11 is applied to the gates of all the transistors 5 to change the transistors 5 to a conductive state to allow current to flow between source and drain.

When the switches 32 are in the second position B, lines Xn 11 are independently addressable over lines 35 and are no longer interconnected. Means to effectuate such sequential switching are not shown. Such means are well known in the art and not of particular importance to this invention as any convenient switching arrangement may be selected without altering the scope of this invention. Switches 32 may be controlled by line 37.

Charge detectors 36 may comprise an operational amplifier wired to measure the charge in a capacitive circuit in which the charge from the microcapacitors produces a voltage output proportional to such charge. The output of detectors 36 may be sampled sequentially to obtain an output signal and the technology to do this is also well known in the art.

In FIG. 1, in addition to the circuitry discussed above connected to the panel 16 and Xn lines 11 and Yn 13 lines addressing means discussed above, there is an additional connection provided for accessing the front conductive layer 9 and the first plurality of microplates $18n$ in order to electrically connect the front conducting layer 9 and the first plurality of microplates $18n$ to a power supply 27 capable of providing a programmable series of variable voltages.

Figure 3:
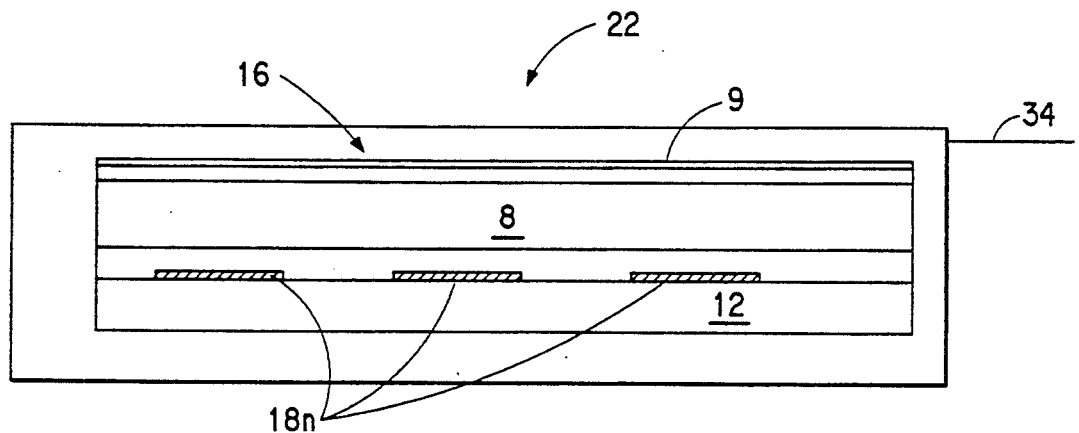
FIG. 3 is a schematic cross sectional view of cassette for using an X-ray image capture panel in accordance with the present invention.

FIG. 3 shows an arrangement in which a cassette or enclosure 22 is used to shield the image capture element 16 from exposure to actinic radiation, much in the manner a cassette shields an X-ray film. The cassette 22 is made of material which is transparent to X-rays. To obtain a latent radiographic image, the element 16 is placed in the cassette 22. The cassette 22 is placed in the path of information modulated X-ray radiation in a manner similar to the way a traditional cassette-photosensitive film combination is positioned. Means 34 are included to allow electrical access to switch contacts for switch 32, and their respective control lines 33, 35 and 37 as well as power supply 27.

Figure 4:
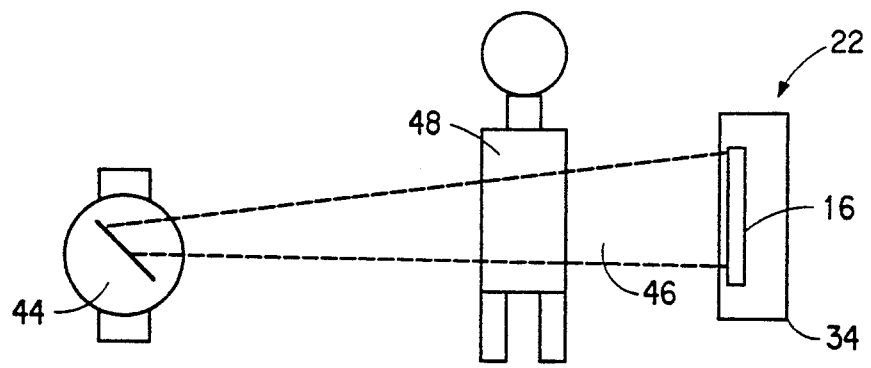
FIG. 4 is a schematic elevation view of an arrangement for using an X-ray image capture panel in accordance with the present invention for capturing a X-ray image.

FIG. 4 shows an schematic arrangement in which a source of X-ray radiation 44 provides a beam of X-rays. A target 48, i.e., a patient in the case of medical diagnostic imaging, is placed in the X-ray beam path. The emerging radiation through the patient 48 is intensify modulated because of the different degree of X-ray absorption in the target 48. The modulated X-ray radiation beam 46 is intercepted by the cassette 22 containing element 16. X-rays which penetrate the enclosure 22 are absorbed by the photoconductive layer 8.

In operation, the switches 32 are first placed in position A where a bias voltage, typically 5 volts, is simultaneously applied to all Xn lines 11. In addition, a voltage of typically 5 volts is applied to an array reset line 91 causing all array reset transistors 93 to become conductive. All charge storage capacitors 6 are electrically shorted to ground through the array reset transistors. Also, all charge amplifiers 36 are reset through line 39. An initial operating DC voltage such as 1000 v is applied at a controlled rate to the top conducting layer 9.

Figure 5:
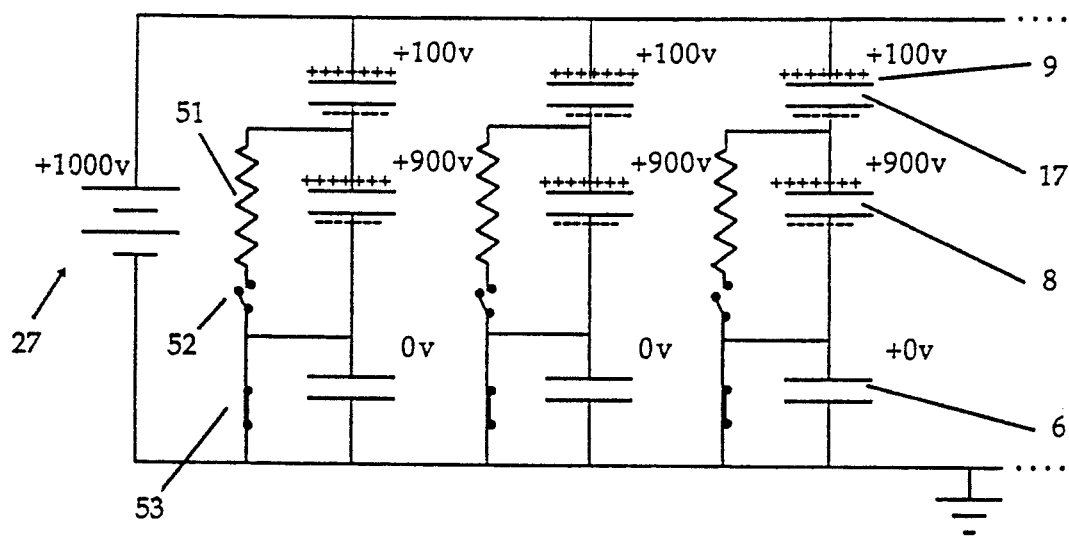
FIG. 5 represents an electrical equivalent of an element in accordance with this invention after an initial operating bias voltage is applied, prior to exposure to X-ray radiation.

FIG. 5 is an simplified equivalent electric circuit of the dielectric layer 17, the photoconductor layer 8 and the charge storage capacitor 6 forming three microcapacitors in series before application of the impinging radiation. In parallel with the photoconductor 8, there is shown a switch 52 and a resistor 51 representing the effect of the electron hole pair generation and transport in the photoconductive layer 8 on the capacitance of that capacitor to be described next. When an initial positive operating voltage is connected across the element 16 as shown in FIG. 5, in the absence of X-ray radiation, and with transistors 5 and array reset transistors 93 turned to a conductive state, the equivalent of closing the swotch 53, no charge will be accumulated in the charge storage capacitors 6. In the described structure, this will result in two different voltages appearing across the capacitors, one across the microcapacitors representing the photoconductor layer 8, and the second across the microcapacitors representing the dielectric layer 17. If, for instance, the applied voltage source 27 is 1000 volts, it could be distributed across the two capacitors as 100 volts across the dielectric 17, and 900 volts across the photoconductor 8. Upon stabilization of the electric field, the voltage on the Xn lines biasing the transistors 5 is changed to a second operating voltage causing the transistors 5 to become non-conductive, by placing switches 32 in position B. The array reset transistors 93 are also caused to become non-conductive by a similar process. This is equivalent to opening the switch 53.

Figure 6:
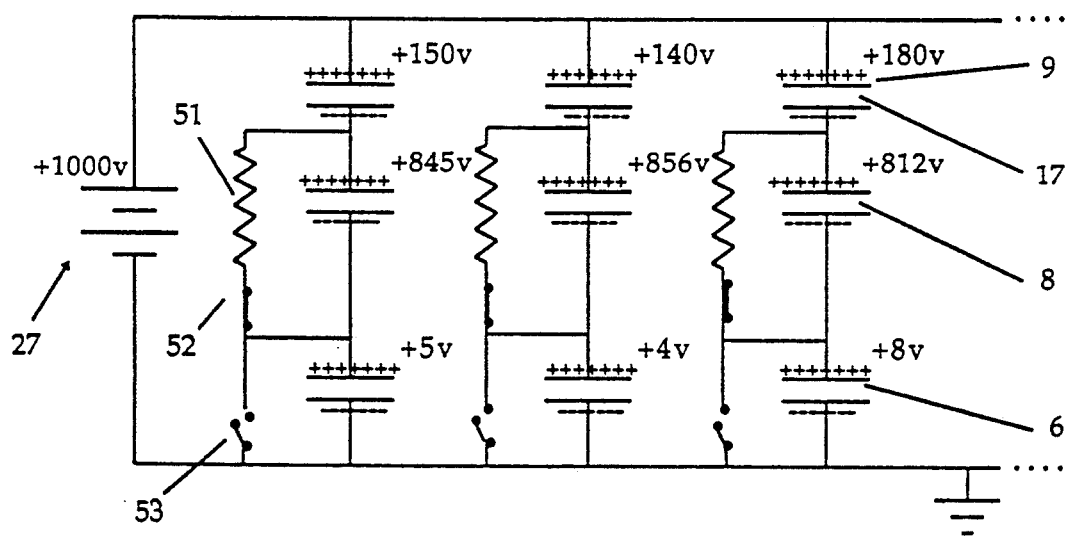
FIG. 6 represents an electrical equivalent of an element in accordance with this invention immediately after exposure to X-ray radiation and after the operating voltage is removed.

FIG. 6 shows the effect on the voltage redistribution pattern of different amounts of incident radiation at different pixels. During X-ray exposure, image wise modulated X-ray radiation impinges on the panel 16. The X-rays generate excess electron hole pairs within the photoconductive layer and, in the presence of the electric field caused by the difference in voltage between the front conducting layer 9 and the microplates 18n, holes migrate toward the interface between the photoconductive layer 8 and the charge blocking layer 10 in the region above the microplates 4n. The amount of electron hole pairs generated throughout the photoconductive layer 8 is dependent on the intensity of imagewise modulated X-ray radiation impinging on the image capture element 16. Positive charges accumulate across the microstorage capacitors 6 and change the voltage pattern, for instance, to those voltages depicted in FIG. 6.

In the present invention, the plurality of charge barrier layers 10 and the barrier dielectric layer 17 are important features which prevent charge build-up on the charge storage capacitors 6 due to leakage current during X-ray exposure. When the positive operating voltage is applied to the top conducting layer 9, the barrier dielectric layer 17 prevents holes from being injected into the photoconductive layer 8 from the conducting layer 9, and the charge barrier layers 10 prevent electrons from being injected into the photoconductive layer 8 from the inner microplates 4n, thereby preventing any resulting leakage current across the photoconductive layer 8 from causing additional charge build-up on the storage capacitors 6 which is not due to the X-ray image. Consequently, the resulting X-ray image is not affected by charge build-up due to leakage current, and the resolution of the X-ray image is enhanced.

After a predetermined time period the X-ray flux is interrupted and X-rays no longer impinge on the element 16. The application of the initial operating voltage to the top conducting layer 9 is then removed, thus capturing a radiographic image in the element 16 in the form of stored charges in microcapacitors formed by the microplates 4n and the dielectric 19 and the microplates 18n.

Following removal of the initial operating voltage from the element 16, the cassette 22 may be handled in the presence of actinic radiation without loss of the stored image information contained in it as a charge distribution in the microcapacitors across the dielectric blocking layer 19 since the transistors 5 are shielded from actinic radiation and microplates 4n are thus isolated from each other.

Referring again to FIG. 2, each of the Xn lines 11 is sequentially addressed by applying an appropriate bias voltage to the line and thus to the gate of the FETs 5 connected to the addressed Xn line 11. This renders the FETs 5 conductive and the charges stored in the corresponding charge storage capacitors 6 flow to the Yn 13 lines and to the input of charge detectors 36. Charge detectors 36 produce a voltage output proportional to the charge detected on the line Yn 13. The output of the amplifying charge detectors 36 is sequentially sampled to obtain an electrical signal representing the charge distribution in the microcapacitors along the addressed Xn line 11, each microcapacitor representing one image pixel. After the signals from one line of pixels along an Xn line 11 are read out, the charge amplifiers are reset through reset line 39. A next Xn line 11 is addressed and the process repeated until all the charge storage capacitors have been sampled and the full image has been read out. The electrical signal output may be stored or displayed or both.

Figure 7:
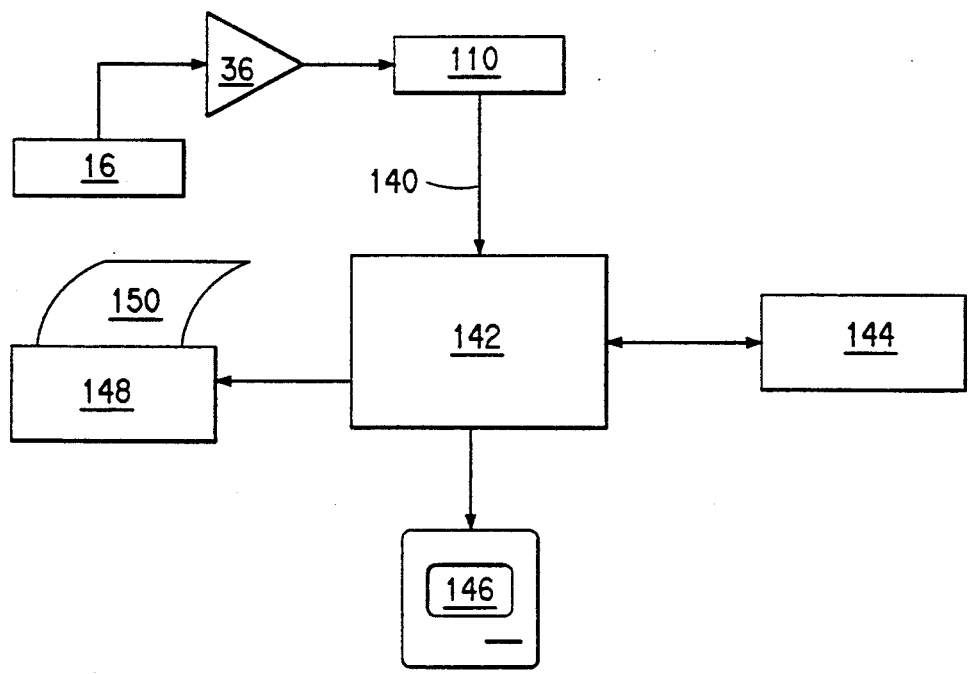
FIG. 7 is a block diagram of an arrangement for the capture and display of a radiogram using the X-ray image capture panel of the present invention.

FIG. 7 shows the signal obtained from the charge amplifier 36 preferably converted to a digital signal in an analog to digital (A/D) converter 110. The signal is directed over line 140 from the A/D converter 110 to a computer 142. Computer 142, inter alia, directs the signal to appropriate storage means which may be both a internal RAM memory or a long term archive memory 144 or both. In the process, the data representing the radiogram may undergo image processing, such as filtering, contrast enhancement and the like, and may be displaced on a CRT 146 for immediate viewing or used in a printer 148 to produce a hard copy 150.

Figure 8:
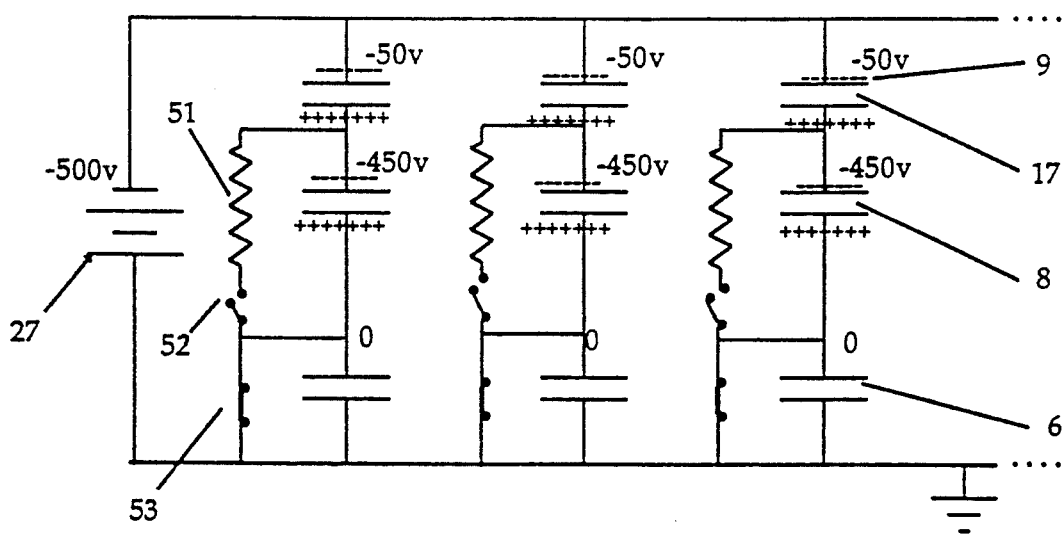
FIG. 8 represents an electrical equivalent of an element in accordance with this invention just after the bias voltage is reversed and lowered to a negative potential.

FIG. 8 shows how the panel 16 is prepared to capture additional X-ray images. After a signal has been recovered, for example using the process described, residual charges are eliminated by interconnecting all Xn lines 11 and again applying a bias voltage to the Xn lines 11 to render the transistors 5 conductive and as a result discharging completely all charge storage capacitors. All charge amplifiers 36 are reset through reset line 39. The initial operating voltage is reapplied to the front conducting panel 9, and at a controlled rate the operating voltage is reduced during a predetermined time period from the operating bias voltage to zero voltage and to a further reversed voltage which can be equal to or less than the magnitude of the original positive operating bias voltage. This reversed voltage polarity allows holes to be injected from the microplates 4n through the charge barrier layer 10 into the photoconductive layer 8. This movement of holes through the photoconductive layer 8 continues until the electrons previously trapped within the photoconductive layer 8 are recombined with holes, eliminating the previously retained imagewise modulated charge distribution pattern. The magnitude of the reversed polarity operating voltage is lowered over a second predetermined time period back to zero voltage. This erasing process is repeated until all the trapped charges are removed and the image capture panel prepared for subsequent image capture operations.

What is claimed is:

1. In an image capture element including a dielectric substrate layer having a top surface and a bottom surface, a plurality of transistors arrayed adjacent the top surface of said dielectric layer, a plurality of charge storage capacitors also arrayed adjacent the top surface of said dielectric layer, each capacitor having a conductive inner microplate connected to at least one of said transistors, said inner microplate having a top surface opposite said dielectric layer, means disposed adjacent the top surface of said dielectric layer for electronically activating said transistors and individually accessing each of said capacitors, a photoconductive layer disposed over said transistors and said means for activating and accessing, and a top conducting layer disposed over said photoconductive layer opposite said dielectric layer, the improvement comprising a plurality of charge barrier layers disposed adjacent, respectively, the top surface of each of said inner microplates, and a barrier dielectric layer disposed between and coextensive with said photoconductive layer and said top conducting layer.

2. The element in accordance with claim 1, wherein each capacitor also comprises a conductive outer microplate disposed on the top surface of said dielectric layer, and dielectric material disposed over said outer microplate, said inner microplate being disposed over said dielectric material opposite said outer microplate.

3. The element in accordance with claim 2, wherein said inner microplates comprise aluminum and wherein said charge barrier layers comprise aluminum oxide.

4. The element in accordance with claim 2, wherein said inner microplates comprise indium-tin oxide.

5. The element in accordance with claim 2, wherein each transistor is a thin-film field effect transistor (FET) having a source connected to one of said inner microplates, and a drain and a gate both connected to said means for activating.

6. The element in accordance with claim 5, wherein said transistor comprises a material selected from the group consisting of amorphous silicon, polycrystalline silicon, crystalline silicon and cadmium selenide.

7. The element in accordance with claim 5, further comprising a passivation layer disposed between said photoconductive layer and each of said transistors.

8. The element in accordance with claim 5, wherein the means for activating and accessing comprise:
a plurality of discrete conductive address lines extending along the transistors and being connected, respectively, to the gates of adjacent transistors, and
a plurality of discrete conductive sense lines extending along the transistors in a direction across the address lines and being connected, respectively, to the drain regions of adjacent transistors.

9. The element in accordance with claim 8, further comprising means for applying a variable operating voltage to the top conducting layer relative to a ground voltage maintained at the outer microplates.

10. The element in accordance with claim 8, further comprising means for switching said address lines and said sense lines from a first charge state to a second readout state.

11. The element in accordance with claim 8, further comprising charge measuring means connected to said sense lines for converting electrical charge stored in said capacitors into analog signals.

12. The element in accordance with claim 1, in combination with an enclosure surrounding said element to form a portable electronic cassette, said enclosure including an external electrical cable connected to said element for providing power to said element and for reading electrical signals from said element.

13. A method for capturing a radiogram on an image capture element comprising:
a dielectric substrate layer having a top surface and a bottom surface;
a plurality of transistors arrayed adjacent the top surface of said dielectric layer;
a plurality of charge storage capacitors also arrayed adjacent the top surface of said dielectric layer, each capacitor having a conductive inner microplate connected to at least one of said transistors, each inner microplate having a top surface opposite said dielectric layer, each capacitor also having a conductive outer microplate disposed on the top surface of said dielectric layer, dielectric material disposed over said outer microplate, said inner microplate being disposed over said dielectric material opposite said outer microplate;
means disposed adjacent the top surface of said dielectric layer for electronically activating said transistors and individually accessing each of said capacitors, said means for activating and accessing including a plurality of discrete conductive address lines extending along the transistors and being connected, respectively, to gates of adjacent transistors, and a plurality of discrete conductive sense lines extending along the transistors in a direction across the address lines and being connected, respectively, to drain regions of adjacent transistors;
charge amplifying means connected, respectively, to said sense lines for converting electrical charge in said capacitors into analog signals;
a photoconductive layer disposed over said transistors and said means for activating and accessing;
a top conducting layer disposed over said photoconductive layer opposite said dielectric layer;
a plurality of charge barrier layers disposed adjacent, respectively, the top surface of each of said inner microplates; and
a barrier dielectric layer disposed between and coextensive with said photoconductive layer and said top conducting layer, the method comprising:
(a) bringing all address lines to a first bias value, connecting said inner microplates to electrical ground potential, and setting said charge storage capacitors to a no-signal level;
(b) applying a positive operating voltage to the top conducting layer while maintaining said outer microplates at electrical ground potential;
(c) removing said first bias value from all address lines so that said charge storage capacitors are capable of accumulating electrical charges;
(d) exposing the photoconductive layer to imagewise modulated radiation, causing electrical charges to be generated within the photoconductive layer at a density proportional to the amount of radiation;
(e) stopping the radiation and disconnecting the initial positive operating voltage applied to the top conducting layer, effectively creating a distribution of electrical charges within the image capture element;

(f) applying a signal sequentially through the plurality of address lines to the transistors, so as to allow the charges collected in the capacitors to flow from the capacitors into the plurality of sense lines; and (g) activating the charge amplifying means to accumulate the charges from each charge storage capacitor, this cumulative value later being digitized and stored in memory 1.

14. A method according to claim 13, further restoring the image capture element to its original state, comprising:

(a) applying a gate signal through the address lines to the transistors so as to allow all charges remaining in the charge storage capacitors to flow from the capacitors into the sense lines;

(b) electrically grounding the charge amplifying means connected to ensure an electrically neutral ground at each charge storage capacitor;

(c) reconnecting the positive operating voltage to the top conducting layer and, at a controlled rate, decreasing the voltage to an electrically neutral ground value and then with reversed polarity continuing to decrease the voltage to a second operating negative voltage so as to neutralize any electrical charges remaining in the photoconductive layer; and (d) reducing the reversed operating voltage back to electrically neutral ground voltage, effectively re-initializing the image capture element.

* * * * *